United States Patent [19]
Wakayama et al.

[11] Patent Number: 6,025,604
[45] Date of Patent: Feb. 15, 2000

[54] FINE PROJECTION STRUCTURE AND FABRICATING METHOD THEREOF

[75] Inventors: Yutaka Wakayama; Shun-ichiro Tanaka, both of Yokohama, Japan

[73] Assignees: Japan Science and Technology Corporation; Kabushiki Kaisha Toshiba, both of Japan

[21] Appl. No.: 09/094,031

[22] Filed: Jun. 9, 1998

[30] Foreign Application Priority Data

Jun. 11, 1997 [JP] Japan .................. P9-153651

[51] Int. Cl.⁷ .................. H01L 29/06; H01L 31/0328; H01L 31/0336; H01L 31/072
[52] U.S. Cl. .................. 257/14; 257/22
[58] Field of Search .................. 257/17, 14, 22

[56] References Cited

U.S. PATENT DOCUMENTS 5,006,914  4/1991  Beetz, Jr. et al. .
5,757,029  5/1998  Narui et al. .
5,828,076  10/1998  Gossner et al. .

*Primary Examiner*—Sheila V. Clark
*Attorney, Agent, or Firm*—Finnegan, Henderson, Farabow, Garrett & Dunner, L.L.P.

[57] ABSTRACT

Dispose a fine metal particle on a semiconductor substrate. By heat-treating this in a vacuum, a constituent element of the semiconductor substrate is dissolved into the fine metal particle to form a solid solution, resulting in further formation of a homogeneous liquid phase (liquid droplet) composed of semiconductor-metal. By annealing this, the constituent element of the semiconductor substrate is precipitated from the semiconductor-metal liquid droplet. Thus, a fine projection composite structure comprising a semiconductor substrate, a semiconductor fine projection epitaxially grown selectively at an arbitrary position on the semiconductor substrate, and a metal layer disposed selectively on the semiconductor fine projection, can be obtained. The metal layer can be removed as demands arise. Such a fine projection composite structure possesses applicability in, for instance, an ultra-high integration semiconductor device or a quantum size device.

11 Claims, 3 Drawing Sheets

POINT A

POINT B

POINT C

FINE PROJECTION STRUCTURE AND FABRICATING METHOD THEREOF

BACKGROUND OF THE INVENTION

1. Field of the Invention

The present invention relates to a fine projection composite structure in which a fine projection such as a semiconductor dot or a semiconductor/metal composite dot both of nanometer scale is formed on a semiconductor substrate, and a fabricating method thereof.

2. Description of the Related Art

An integration rate of a semiconductor device represented by a DRAM is increasing year by year. For instance, the integration rate of a DRAM has been heightened from 16 Mbit to 64 Mbit or 256 Mbit, and further development of a semiconductor device of the integration rate of more than Gbit is under way. Such a high integration of a semiconductor device has been achieved through reduction of a unit element size down to sub-micron order. For miniaturization of the unit size, development in lithography technology has largely contributed. In addition to improvement of lithography technology, improvement of an element structure is also in progress.

Concerning the lithography technology, due to improvement of i-line exposure technique and positive photo-resist, 0.5 $\mu$m rule corresponding to 16 Mbit-DRAM is being put into practical use. Further, due to development of the exposure technique using KrF excimer laser which can correspond to 0.25 $\mu$m rule, 64 Mbit-DRAM is being mass produced and the practical use of 256 Mbit-DRAM is under way. Further, correspondence to 0.18 $\mu$m rule due to improvement of the exposure technique employing KrF excimer laser or development of the exposure technique employing the SOR light is under way. However, the limit of present lithography technology is considered to be about 0.1 $\mu$m rule. Therefore, in order to achieve further higher integration, it is desired to be realized in the future a unit element size of nanometer scale.

Further, a quantum-size device is attracting attention as a candidate of future LSI technology. Realization of a new device utilizing a quantum-size effect or a tunnel effect, for example, such as a quantum wire device or a quantum dot device which makes use of a wire or a dot structure of which sectional dimension is at the same degree with a quantum mechanical wavelength of an electron, a resonant tunnelling effect device or a resonant tunnelling element utilizing a quantum well and so on, are being tried.

In order to develop a new device which positively utilizes a quantum effect, a characteristic dimension of an element should not remain in a phase wavelength (0.1 to 1 $\mu$m) order, namely in a mesoscopic region, but should be brought into an electron wavelength order (10 to 100 nm), namely in a microscopic region. Further, in order to utilize more effectively a quantum effect device, ultra-miniaturization of the unit element size itself of, for instance, 10 to 100 nm, more preferably less than 10 nm, is required. However, it is far beyond the present lithography technology level.

As described above, research and development of the quantum size device and the like which are expected as candidates of a ultra-high integration semiconductor device or future LSI technology are under way. To materialize such a fine device, a unit element size of nanometer scale is required to be achieved. Therefore, a technology enabling to obtain with reproducibility a semiconductor dot or a semiconductor/metal composite dot, which is necessary for a ultra-high integration semiconductor device or a quantum-size device, is desired to be developed.

SUMMARY OF THE INVENTION

Therefore, the objective of the present invention is to provide a fine projection structure of nanometer scale, which enables to realize a high integration semiconductor device or a quantum-size device, and fabricating method thereof.

A first fine projection composite structure of the present invention comprises a semiconductor substrate, a fine projection consisting of a semiconductor grown selectively on the semiconductor substrate with an epitaxial relation to the semiconductor substrate, and a metal layer disposed selectively on the fine projection.

A second fine projection structure of the present invention comprises a semiconductor substrate and a fine projection consisting of a semiconductor grown selectively on the semiconductor substrate with an epitaxial relation to the semiconductor substrate.

A producing method of a fine projection composite structure of the present invention is comprising of a process of disposing a fine metal particle on a semiconductor substrate, a process of heat-treating the semiconductor substrate on which the fine metal particle is disposed at a temperature higher than the temperature where a constituent element of the semiconductor substrate is incorporated into the fine metal particle to form a solid solution in vacuum atmosphere, and a process of annealing for growing the constituent element of the semiconductor substrate epitaxially with respect to the semiconductor substrate from a solid solution phase in which the constituent element of the semiconductor substrate is dissolved into the fine metal particle to form a solid solution.

In the present invention, a heat treatment is given to a semiconductor substrate being disposed with fine metal particles, at first, at a temperature where a constituent element of the semiconductor substrate is incorporated into the fine metal particles to form a solid solution in a vacuum atmosphere, further, at a temperature equal or more than that where the constituent element of the semiconductor substrate and the fine metal particles dissolve to form a homogeneous liquid solid solution phase. By annealing from this liquid solid solution state, the constituent element of the semiconductor substrate can be precipitated from the liquid solid solution phase.

Through precipitation from such a liquid phase, the constituent element of the semiconductor substrate grows epitaxially with respect to the semiconductor substrate. Further, the constituent element of the semiconductor substrate and the fine metal particle separate. Therefore, according to the size and the position of the initial fine particles, semiconductor fine projections can be formed epitaxially with respect to the semiconductor substrate. In addition, even after the constituent element of the semiconductor substrate is precipitated, the fine metal particles remain on the semiconductor fine projections as metal layers. Therefore, a fine composite structure having a hetero-junction interface between a semiconductor layer having a projection shape (semiconductor fine projection) and a metal layer can be obtained.

The shape of a semiconductor fine projection can be, for example, a trapezoid-like shape or variation thereof. The fine projection of the trapezoid-like shape or modification thereof can be reduced to 1 $\mu$m or less in diameter at the maximum portion thereof, more preferably to 100 nm or less. The fine projection of the trapezoid-like shape or modification thereof can be made to 50 nm or less in diameter at the minimum portion thereof, more preferably to 10 nm or less. The size of the metal layer existing at the upper portion of semiconductor fine projection can be made nearly identical. Further, through elimination of the metal layer at the upper portion, only a semiconductor fine projection can be obtained. According to such a fine projection, a unit element size of nanometer scale, which is required in, for example, a ultra-high integration semiconductor device or a quantum-size device, can be realized.

DESCRIPTION OF THE PREFERRED EMBODIMENTS

In the following, embodiments carrying out the present invention will be described with reference to the drawings.

Figure 1A:
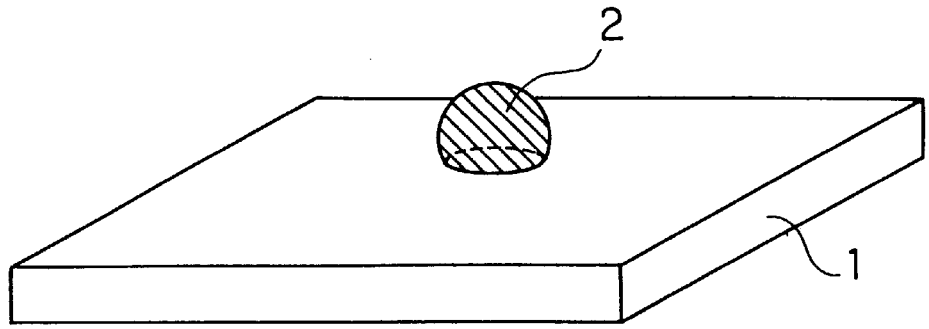
FIG. 1A, FIG. 1B, FIG. 1C and FIG. 1D are diagrams schematically showing one embodiment of fabricating processes of a fine projection composite structure of the present invention and a fine projection composite structure obtained thereby.

FIG. 1A, FIG. 1B, FIG. 1C and FIG. 1D are diagrams schematically showing one embodiment of producing processes of a fine projection composite structure of the present invention. At first, as shown in FIG. 1A, a fine metal particle 2 is disposed on a semiconductor substrate 1.

As a semiconductor substrate 1 and a fine metal particle, a combination of a semiconductor and a metal, which, from a thermodynamic point of view, forms a solid solution at an elevated temperature and separates at low temperature, can be employed. When a Si substrate is employed as the semiconductor substrate 1, for instance, as a constituent member of the fine metal particle 2, Au, Ag, Al and the like can be employed. In addition, when a Ge substrate is employed as a semiconductor substrate 1, as a constituent member of the fine metal particle 2, Zn, Cd, Au, Ag, Al can be employed. Like this, various combinations of semiconductors and metals, which form solid solutions at an elevated temperature and separate at a low temperature, can be used.

When forming a fine metal particle 2, the surface of a semiconductor substrate 1 should be made sufficiently clean. On the surface of such a semiconductor substrate 1, the fine metal particle 2 is formed under decompression or vacuum state. The formation method of the fine metal particle 2 is not restricted to the particular one but a method capable of forming the fine metal particles 2 on the semiconductor substrate 1 held at room temperature can be employed. If a fine metal particle 2 is formed on a heated semiconductor substrate 1, it is likely that a reaction layer or the like is formed at the interface between the semiconductor substrate 1 and the fine metal particle 2 and is likely to adversely affect on the later processes. As a method forming fine metal particles 2, a gas phase condensation method of metal can be cited.

The particle size of the fine metal particle 2, as will be described later, can be a size with which the fine metal particle can incorporate a semiconductor element (Si atoms, for instance) diffusing on the semiconductor substrate 1 during heat-treatment, resulting in formation of a semiconductor-metal solid solution. To be specific, the diameter of the fine metal particle 2 is preferred to be 1 $\mu$m or less, more preferable to be 100 nm or less. When an initial particle size of the fine metal particle 2 is too large, during formation process or heat treatment process thereof, it is likely that a reaction layer or the like is formed at the interface between the semiconductor substrate 1 and the fine metal particle 2. The interface reaction layer tends to adversely affect on the later processes and to disturb the precipitation of the semiconductor atoms from the semiconductor-metal solid solution phase.

Figure 1B:
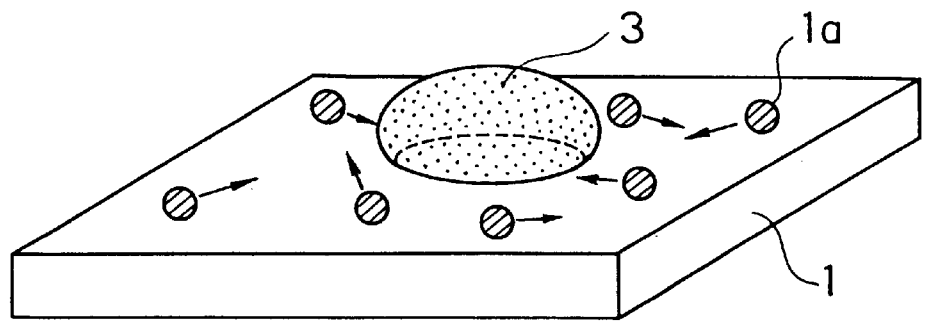

Next, to the semiconductor substrate 1 disposed with the fine metal particles 2, heat treatment is carried out at a temperature higher than that where a constituent element of the semiconductor substrate 1 can dissolve into the fine metal particle 2 to form a solid solution in a vacuum. As illustrated in FIG. 1B, when the semiconductor substrate disposed with the fine metal particle 2 is heat treated in a vacuum, during the temperature elevating process, a rapid diffusion of its constituent atoms 1a occurs on the surface of the semiconductor substrate 1. The diffusing atoms (semiconductor atoms) 1a are incorporated into the fine metal particle 2. Thus, a semiconductor-metal solid solution phase is formed.

In particular, by carrying out the heat treatment at a temperature higher than that where a liquid phase, in which the fine metal particle 2 and the semiconductor atoms 1a are homogeneously dissolved, can be formed, a homogeneous semiconductor-metal solid solution liquid phase, that is, a semiconductor-metal liquid droplet 3 can be obtained. The heat-treatment temperature, when the semiconductor substrate 1 and the fine metal particle 2 form an eutectic, is at least its eutectic temperature or more. Anyway, it can be a temperature higher than or equal to that where a semiconductor-metal liquid droplet 3 can be formed. Here, a semiconductor-metal solid solution phase is preferred to be a liquid phase but can be a pseudo-liquid phase where semiconductor atoms and metal atoms are rapidly diffusing.

Figure 1C:
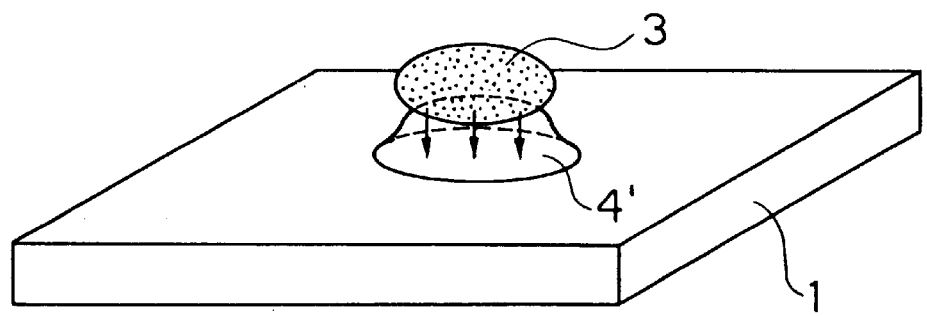

After formation of a liquid droplet 3 consisting of a semiconductor-metal solid solution liquid phase, this is annealed. As illustrated in FIG. 1C, during annealing, constituent atoms of the semiconductor substrate 1 precipitate from within a semiconductor-metal droplet 3 to a solid-liquid interface between the liquid droplet 3 and the semiconductor substrate 1, and precipitate with an epitaxial relation with respect to the semiconductor substrate 1. Precipitation of the constituent atoms of the semiconductor substrate 1 are considered to base on the size effect of the semiconductor-metal liquid droplet 3, the heat treatment temperature, the cooling speed and so on. Though the cooling rate is different depending on constituent material, about 2 K/min or less is preferable.

As described above, the constituent atoms of the semiconductor substrate 1 gradually precipitate from the semiconductor-metal liquid droplet 3, and precipitate maintaining an epitaxial relation with respect to the semiconductor substrate 1, thus, a semiconductor layer 4' grows projectingly between the semiconductor-metal liquid droplet 3 and the semiconductor substrate 1. That is, the constituent atoms of the semiconductor substrate 1 grow due to liquid phase epitaxy from the semiconductor-metal liquid droplet 3. On the semiconductor substrate 1, a projection-like semiconductor layer 4' is gradually formed.

Figure 1D:
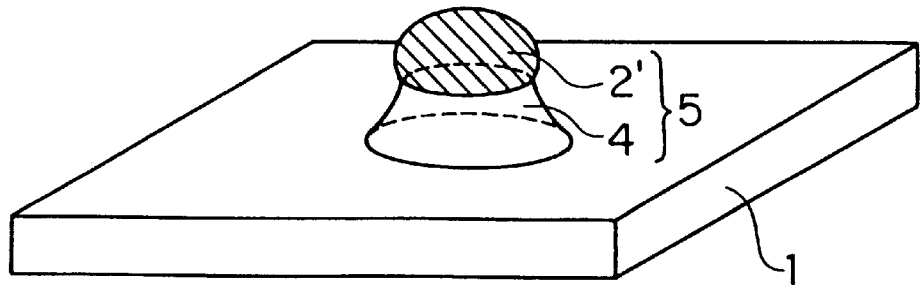

And, by completing the precipitation of the semiconductor atoms from the semiconductor-metal liquid droplet 3 within the cooling process, as illustrated in FIG. 1D, a semiconductor fine projection 4 can be formed almost completely separated from metal matrix (metal fine particle 2). Besides, the fine metal particle 2 remains as a metal layer 5 at the upper portion of the semiconductor fine projection 4. Thus, on the surface of the semiconductor substrate 1, a fine composite projection 5 of 2 layered structure, which is composed of the semiconductor fine projection 4 possessing a selective and epitaxial relation, and a metal layer 2' disposed selectively on the semiconductor fine projection 4, can be formed.

The semiconductor fine projection 4 and the metal layer 2' in the fine composite projection 5 can be completely separated. The shape of the semiconductor fine projection 4, since the semiconductor atoms grow through gradual precipitation from the semiconductor-metal liquid droplet 3, its cross-section becomes a projection like having a nearly trapezoid shape. The semiconductor fine projection 4 becomes a truncated cone shape, for instance. The semiconductor fine projection 4, depending on the initial size of the fine metal particle 2, can be made 1 µm or less in diameter at its maximum portion and about 50 nm or more in diameter at its minimum portion. The size of the semiconductor fine projection 4 can be further reduced to 100 nm or less in diameter at its maximum portion and 10 nm in diameter at its minimum portion. The metal layer 2' can be made to have, for instance, the maximum diameter nearly equal to the diameter at the minimum portion of the semiconductor fine projection 4 and to have a cross-section of a nearly triangle shape possessing such the minimum diameter as 1 nm or less.

Thus, by applying a fabricating method of the present invention, on an arbitrary position of a semiconductor substrate 1, a fine composite projection 5 of a 2 layered structure, which has a semiconductor fine projection 4 which is about 100 nm or less (more preferably 50 nm or less) in diameter at its maximum portion and is epitaxially grown selectively with respect to the semiconductor substrate 1, and a metal layer 2' which is disposed selectively on the semiconductor fine projection 4 and is nearly completely separated from the semiconductor fine projection 4, can be formed. In other words, a nanometer scale composite dot 5 having a hetero-junction interface composed of almost completely separated semiconductor/metal can be obtained. When the size of the initial fine metal particle 2 is small such as 10 nm or less, the metal layer 2' also grows epitaxially with respect to the semiconductor fine projection 4.

The size of the semiconductor fine projection 4 can be controlled through the size of the initial fine metal particle 2 or the heat treatment temperature. Further, through control of the disposing position of the fine metal particle 2, the formation position of the semiconductor fine projection 4 can be controlled on the surface of the semiconductor substrate 1. Through the use of such a fine composite projection 5 of the 2 layered structure, a unit element size of, for example, nanometer scale can be made to be realized. It is remarkably effective for realizing an ultra-high integration semiconductor device or a quantum size device. Other than these, various kinds of fine devices can be materialized.

Figure 2:
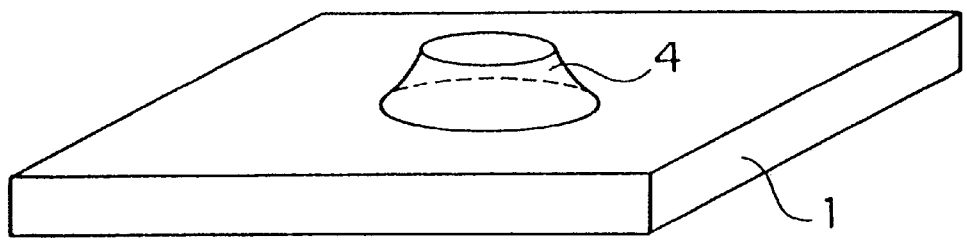
FIG. 2 is a diagram schematically showing a structure of another fine projection composite structure of the present invention.

When only a semiconductor fine projection 4 is necessary, a metal layer 2' can be removed. By undergoing such a process, as illustrated in FIG. 2, on an arbitrary position of the surface of the semiconductor substrate 1, a semiconductor fine projection 4, the diameter of which at the maximum portion is 100 nm or less (more preferably 50 nm or less) and which is epitaxially grown selectively with respect to the semiconductor substrate 1, can be obtained. A fine projection consisting only of such a semiconductor fine projection 4 is also effective when realizing an ultra-high integration semiconductor or a quantum size device.

In the following, concrete embodiments of the present invention will be described.

Embodiment 1

At first, a Si(111) single-crystal substrate (non-doped, $a_0$=0.5431 nm) is prepared. After the Si(111) single-crystal substrate is treated by chemical cleaning, to remove a native oxide layer and to obtain a hydrogen-terminated Si surface, the Si substrate was dipped in a diluted HF solution (2 weight %) for 30 seconds. Following, pre-treated Si(111) single-crystal substrate was mounted in a vacuum chamber with a background pressure of less than $1\times10^{-6}$ Torr.

Then, on the surface of the above described Si(111) single-crystal substrate, Au fine particles were deposited. The Au fine particles were generated with a gas phase condensation method. That is, by evaporating Au of 99.99% purity in an Ar gas atmosphere, the Au fine particles were deposited on the Si(111) single-crystal substrate. Ar gas pressure was set at 6 Torr to obtain Au fine particles of about 10 nm in diameter. These Au fine particles were deposited on the Si single-crystal substrate at room temperature. Diameter of the obtained Au fine particles was observed with a TEM and was found to be about 10 to 15 nm.

Next, the Si single-crystal substrate deposited with the Au fine particles was heat-treated in a high vacuum chamber of less than $1\times10^{-8}$ Torr. The temperature of the substrate is elevated at a rate of 15 K/min up to 1073K and maintained at this temperature for 30 min. Then, the substrate was gradually cooled at a rate of −2 K/min down to room temperature.

Figure 3:
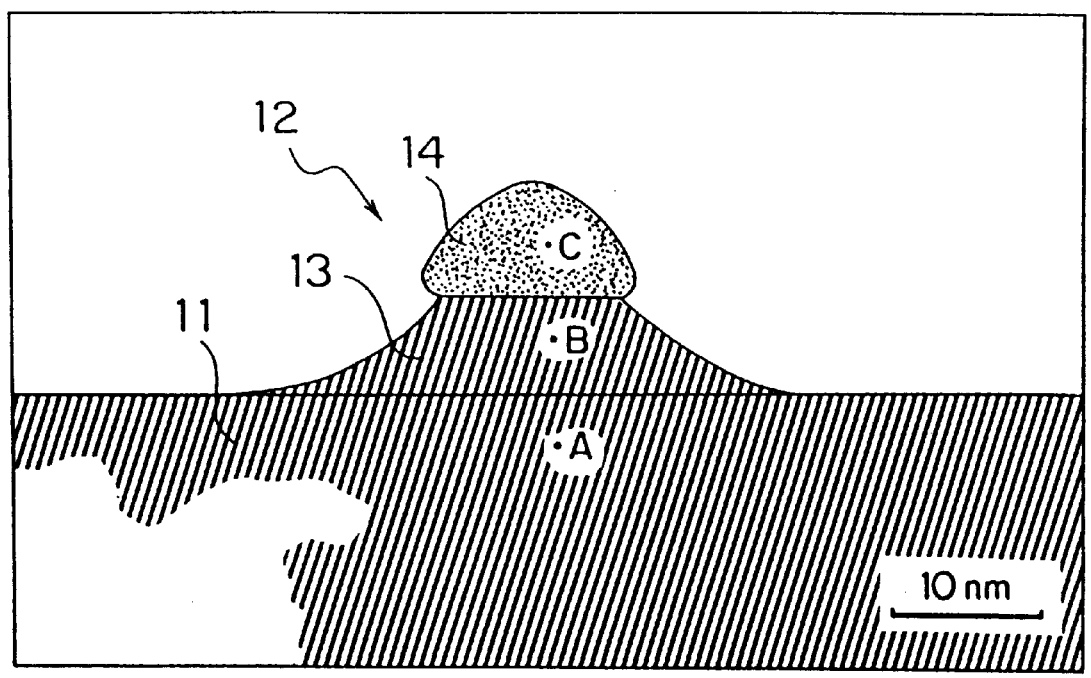
FIG. 3 is a diagram schematically showing TEM observation results of a fine projection composite structure fabricated in embodiment 1 of the present invention.
Figure 4:
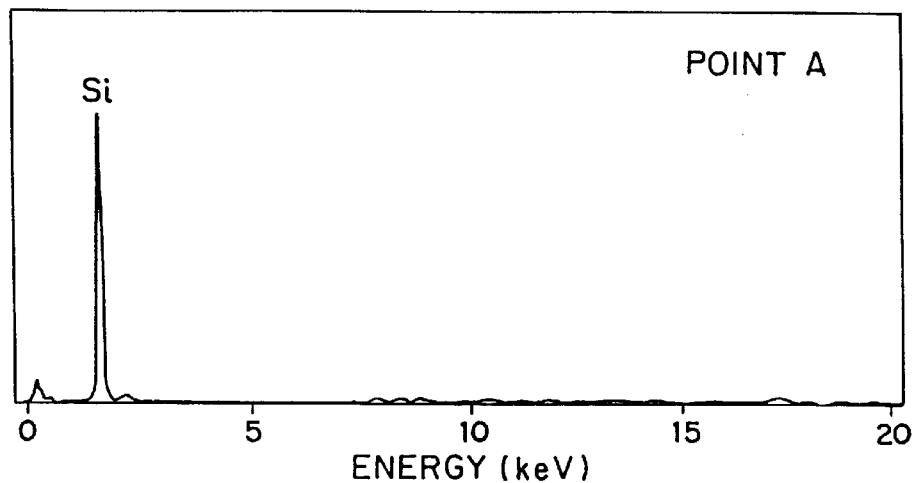
FIG. 4 is a diagram showing a result of an EDX analysis of A portion of the fine projection composite structure shown in FIG. 3.
Figure 5:
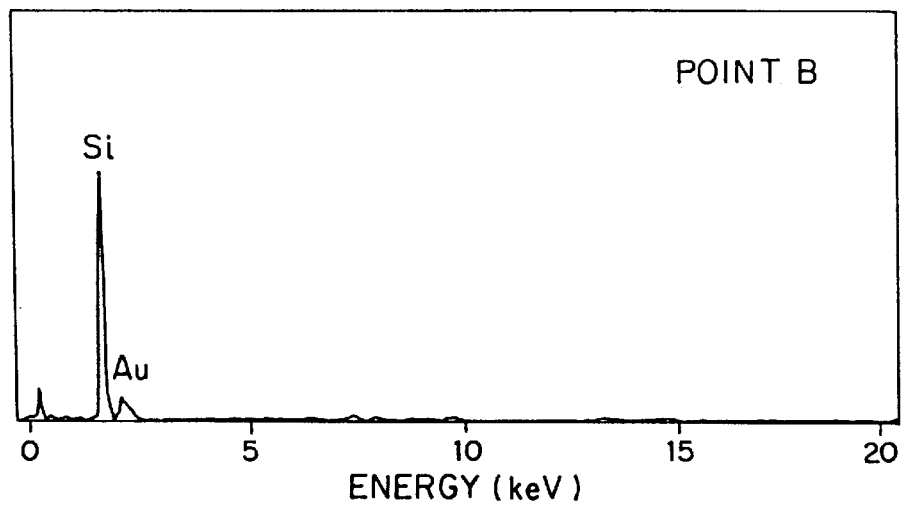
FIG. 5 is a diagram showing a result of an EDX analysis of B portion of the fine projection composite structure shown in FIG. 3.
Figure 6:
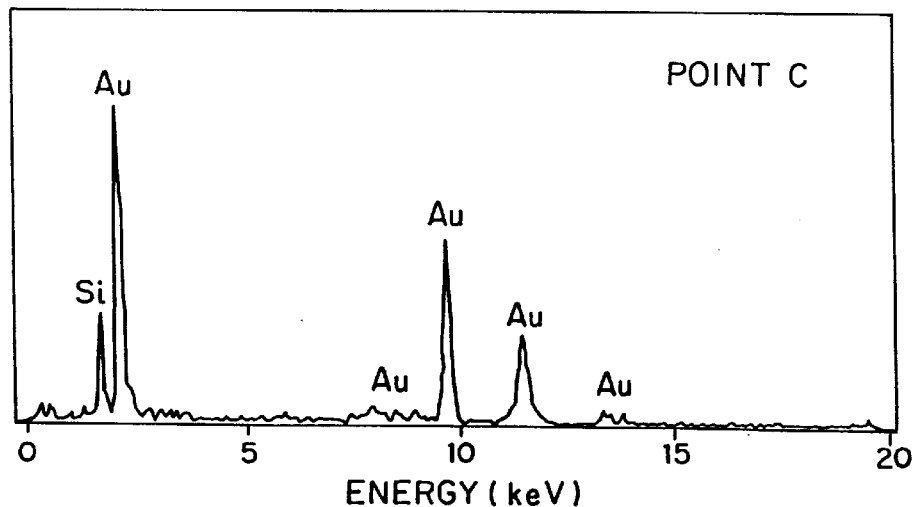
FIG. 6 is a diagram showing a result of an EDX analysis of B portion of the fine projection composite structure shown in FIG. 3.

The structure and the composition of the above described heat treated specimen were evaluated with a high resolution transmission electron microscope (HRTEM, JEOL-2010) and an energy dispersive X-ray spectrometer (EDX, Oxford-Link ISIS). These results are shown in FIG. 3, FIG. 4, FIG. 5 and FIG. 6. FIG. 3 is a diagram schematically illustrating a cross-sectional TEM image of the specimen after heat-treatment. TEM image was taken from <110> direction of the Si single-crystal substrate. FIG. 4, FIG. 5 and FIG. 6 show EDX spectra of each portions of the specimen after heat-treatment.

From a schematized diagram of a cross-sectional TEM image illustrated in FIG. 3, it is obvious that, on the surface of the Si single-crystal substrate 11, a fine dot of a 2 layered structure is formed. In the fine dot 12 of the 2 layered structure, the lower layer portion 13 possesses a truncated cone-like shape, the diameter of its minimum portion was about 10 nm, and that of the maximum portion was about 30 nm. The upper portion 14 possesses the maximum diameter of about 15 nm and a projection like shape of which the minimum diameter at the tip portion is 1 nm or less. Here, in order to evaluate the compositions of each layers 11, 13, 14, EDX spectra were obtained. The EDX analysis was carried out with an electron beam of a diameter converged to less than 5 nm. The evaluated positions are shown in FIG. 3 as point A, point B and point C.

FIG. 4 is an EDX spectrum taken at the point A of FIG. 3, FIG. 5 is an EDX spectrum taken at the point B of FIG.

3, FIG. 6 is an EDX spectrum taken at the point C of FIG. 3. From the results obtained at the point A, as illustrated in the spectrum of FIG. 4, peaks of only Si are apparent. Thus, it is obvious that, even after the heat-treatment, the Si(111) single-crystal substrate 11 maintains its state.

From the results obtained at the point B, as shown in the spectrum of FIG. 5, it is obvious that the lower portion (neck portion) 13 of a fine dot 12 of a 2 layered structure is formed of only Si. In addition, since the peak of Au in the spectrum of FIG. 5 is in the range of error, this layer can be regarded as a Si single crystal layer.

Actually, in the TEM image schematically illustrated in FIG. 3, the lattice image of Si is clearly obtained at the lower portion 13 of the fine dot 12 of the 2 layered structure. In addition, this TEM image clearly shows that the lower portion (Si layer) 13 of the fine dot 12 maintains an identical crystal direction with respect to the Si(111) single-crystal substrate 11. Thus, the truncated cone-like shaped Si layer (Si dot) 13 of about 10 nm in the minimum diameter has epitaxially grown with respect to the Si(111) single-crystal substrate 11 on the surface of the Si(111) single-crystal substrate 11.

Further, from the results obtained at the point C, as shown in FIG. 6, in the upper portion 14 of the fine dot 12 of the 2 layered structure, it is found that Au is a dominant component, though trivial Si being found.

Thus, the fine dot 12 is confirmed to be constituted of a Si dot 13 grown epitaxially with respect to the Si(111) single-crystal substrate 11, and a Au layer 14 which is disposed on the Si dot 13 and is constituted of almost Au alone separated from the Si dot 13. That is, a Si—Au nanometer scale composite dot possessing an almost completely separated Si/Au interface was obtained.

The above described Si—Au nanometer scale composite structure is considered to be formed through the following liquid phase epitaxy. At first, by carrying out the heat treatment in a high vacuum with respect to the Si substrate deposited with Au fine particles, Si atoms diffusing on the surface of the Si substrate are incorporated into the Au particles to form Si—Au liquid droplets. This is evident from that the heat treatment temperature is sufficiently higher than the eutectic temperature of Si—Au of 643K.

By annealing after formation of the liquid droplets obtained by mixing Si and Au in liquid phase, Si atoms precipitate at the liquid-solid interface between Si—Au liquid droplet and Si, and, during cooling process, grow epitaxially on the Si substrate. By completing such precipitation of Si in the course of the cooling process, Si dots are formed almost completely separated from Au fine particles, and Au layers remain on the Si dots.

Further, when the Au layer 14 of the upper portion in the above described Si—Au nanometer scale composite dot 12 is removed, only Si dot 13 which is epitaxially grown with respect to the Si(111) single-crystal substrate 11 was obtained.

As evident from the above described embodiments, according to the present invention, an epitaxial semiconductor dot or a semiconductor-metal composite dot of nanometer scale can be obtained. These remarkably contribute in realizing an ultra-high integration semiconductor device or a quantum-size device.

What is claimed is:

1. A fine projection composite structure comprising:
   a semiconductor substrate;
   a fine projection consisting of a semiconductor which is grown selectively on the surface of the semiconductor substrate with an epitaxial relation with respect to the semiconductor substrate, the fine projection having a trapezoid-like shape in its cross section; and
   a metal layer disposed selectively on the fine projection.

2. The fine projection composite structure as set forth in claim 1:
   wherein, the fine projection of the trapezoid-like shape is 1 μm or less in diameter at its maximum portion, and is 50 nm or less in diameter at its minimum portion.

3. The fine projection composite structure as set forth in claim 1:
   wherein, the fine projection of the trapezoid-like shape is 100 nm or less in diameter at its maximum portion, and is 10 nm or less in diameter at its minimum portion.

4. The fine projection composite structure as set forth in claim 1:
   wherein, the metal layer is a triangle-like shape in its cross section.

5. The fine projection composite structure as set forth in claim 1:
   wherein, the metal layer comprises a metal material which forms a solid solution with a constituent element of the semiconductor substrate at an elevated temperature, and separates at a low temperature.

6. The fine projection composite structure as set forth in claim 1:
   wherein, the semiconductor substrate and the fine projection contain Si, and the metal layer contains at least one kind selected from Au, Ag, and Al.

7. The fine projection composite structure as set forth in claim 1:
   wherein, the semiconductor substrate and the fine projection contain Ge, and the metal layer contains at least one kind selected from Zn, Cd, Au, Ag, and Al.

8. A fine projection structure comprising:
   a semiconductor substrate; and
   a fine projection consisting of a semiconductor which is grown selectively on the surface of the semiconductor substrate with an epitaxial relation with respect to the semiconductor substrate, the fine projection having a trapezoid-like shape in its cross section.

9. The fine projection structure as set forth in claim 8:
   wherein, the fine projection of the trapezoid-like shape is 1 μm or less in diameter at its maximum portion, and 50 nm or less in diameter at its minimum portion.

10. The fine projection structure as set forth in claim 8:
    wherein, the fine projection of the trapezoid-like shape is 100 nm or less in diameter at its maximum portion, and is 10 nm or less in diameter at its minimum portion.

11. The fine projection structure as set forth in claim 8:
    wherein, the fine projection of the trapezoid-like shape is 50 nm or less in diameter at its maximum portion, and is 10 nm or less in diameter at its minimum portion.

* * * * *